US006567762B2

(12) United States Patent
Bourde et al.

(10) Patent No.: US 6,567,762 B2
(45) Date of Patent: May 20, 2003

(54) DYNAMIC RANGE EXTENSION APPARATUS AND METHOD

(75) Inventors: Christian A. Bourde, Santa Rosa, CA (US); J. Barry Taylor, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 186 days.

(21) Appl. No.: 09/746,195

(22) Filed: Dec. 22, 2000

(65) Prior Publication Data

US 2002/0082792 A1 Jun. 27, 2002

(51) Int. Cl.[7] ............................................... G01R 35/00
(52) U.S. Cl. ....................................................... 702/107
(58) Field of Search ........................ 702/107; 327/351, 327/359; 324/76; 348/672; 331/142; 455/126; 330/149, 151; 250/205; 84/603; 341/138; 356/5

(56) References Cited

U.S. PATENT DOCUMENTS

| | | | | |
|---|---|---|---|---|
| 3,775,681 A | * | 11/1973 | Konrad ..................... | 324/76.39 |
| 4,829,172 A | * | 5/1989 | Miller ......................... | 250/205 |
| 4,933,641 A | * | 6/1990 | Hsiung et al. ............... | 327/351 |
| 5,294,986 A | * | 3/1994 | Tsuji et al. .................. | 348/672 |
| 5,789,689 A | * | 8/1998 | Doidic et al. ................ | 84/603 |
| 5,974,362 A | * | 10/1999 | Owen .......................... | 331/42 |
| 6,493,543 B1 | * | 12/2002 | Shin et al. ................... | 455/126 |

* cited by examiner

Primary Examiner—John Barlow
Assistant Examiner—Tung S Lau (57) ABSTRACT

An apparatus, method and system extend the dynamic range measurements performed on a device under test. The apparatus and method compensate for the non-ideal characteristics of the measurement system elements. Further, the apparatus, method and system facilitate low-level distortion measurements and improve the accuracy of such measurements using a novel cancellation signal approach. The dynamic range extension apparatus has an input port for accepting an input test signal from a signal source and an output port for delivering an output signal to a measurement processor. The apparatus comprises a signal splitter at its input, a cancellation pathway, a test pathway and a signal combiner at its output. The system comprises a signal source that provides an input signal to the input of the apparatus and a measurement processor at the output of the apparatus. In the dynamic range extension apparatus, method and system, a signal from the input signal source is split by the signal splitter into two signals. A first split signal passes through the cancellation path where it is phase shifted to produce a cancellation signal. A second split signal passes through the test path where it is applied to the device under test to produce a response signal that is attenuated. At the outputs of the cancellation path and the test path, respectively, the cancellation signal and the attenuated response signal are combined by the signal combiner prior to being delivered to the measurement processor. The measurement processor accepts the output signal from the apparatus and measures the low-level distortion signals within the output signal.

24 Claims, 8 Drawing Sheets

*Prior Art*

FIG. 1A

*Prior Art*

DYNAMIC RANGE EXTENSION APPARATUS AND METHOD

TECHNICAL FIELD

The invention relates to measurement systems. In particular, the invention relates to extending the dynamic range of lower power signal measurements in the presence of higher power signals.

BACKGROUND ART

A critical facet of the design and manufacture of modem communications and related signal transmission systems is the measurement and characterization of signal distortion introduced by the elements that make up the system. All system elements, most notably active devices, such as amplifiers, have non-ideal operational characteristics. These non-ideal operational characteristics can and do distort the signals that pass through or are processed by the elements of the system. The signal distortion introduced by the non-ideal characteristics of the system elements often interferes with the operation of the system. Measurement, characterization and control of system element-related distortion are of paramount importance in most transmission system design and manufacturing activities.

Modern communications systems, especially state-of-the-art wideband systems, are particularly sensitive to signal distortion and its effect on performance. These systems and their designers are faced with ever-increasing demands for greater bandwidth in a finite spectrum and so, must contend with ever-tightening specifications associated with system element-related signal distortion. The ability to perform accurate measurement and characterization of the stimulus/response distortion effects of devices and elements used in the system is a vital consideration in determining the ultimate performance of the system.

Chief among the non-ideal characteristics exhibited by typical devices used in communications systems are non-linear effects. A non-linear effect is defined as the stimulus/response performance of a device that is not completely described by a linear equation. Generally, non-linear effects give rise to signal distortions in the form of a spurious frequency response. That is to say that the device by its operation introduces spectral components into the signal passing through the device that are unwanted and not consistent with the linear operation of that device. Generally, for devices that are classified as linear or quasi-linear, power levels associated with the spurious responses are much lower or smaller than that of the primary or linear response signal. For example, a third order spur from a two-tone measurement might be −60 dBc for a given signal power level relative to the linear response signal. In other words, the spur level is 1,000,000 times smaller than the desired, linear response signal. However, even though the spurious response of a given device is often very small compared to its linear response, the spurious response can have a profound effect on the performance of the system as a whole.

A number of conventional measurement methodologies are used to measure and characterize the non-linear performance of devices used in a communications system. Most of these measurement methodologies either attempt to directly measure an aspect of the non-linear performance of a device or attempt to infer the non-linear performance through an indirect means. Generally, the indirect methodologies focus on measuring the effect of the device non-linearities on some aspect of system performance and therefore, are often referred to as "system level" measurements. Among the direct measurement methodologies are the 1 dB compression point test, the two tone and multi-tone intermodulation response tests, and saturated power tests. Indirect or system level measurements include such things as the bit error rate measurement, eye patterns or eye diagrams, and the adjacent channel power ratio (ACPR). The ACPR is particularly important for modern, wideband code division multiple access (W-CDMA) systems.

The 1 dB compression point test measures the point at which an input or stimulus power level produces an output power level response that deviates from a linear response by 1 dB. The two-tone and multi-tone tests measure the relative level of a particular spurious response or set of responses compared to the level of the linear or fundamental response. These tests are used to predict or infer the so-called second order, third order, and n-th order intercept points in amplifiers. The saturated power test measures the performance of the device at very high input power levels. As pointed out above, all of these direct measurement methodologies attempt to focus on a particular non-linear characteristic (e.g. second order intercept point). Generally, the measured non-linear characteristics are used to infer the effect that the non-ideal performance of a device will have on a signal passing through the system incorporating the device.

In contrast, the indirect measurements focus on a system level performance parameter. In the indirect measurement methodologies, the sum-total of all of the non-linear performance characteristics of a device are tested or measured simultaneously in as much as they affect the performance parameter being measured. For example, a bit error rate test characterizes how a device or series of devices impacts the rate of bit errors at various stimulus signal-to-noise ratios (SNR) for a digital transmission system. The ACPR measures the amount of power that "leaks" from one channel of a system to an adjacent channel as a result of the non-ideal performance of a device under test (DUT). No attempt is generally made to identify what non-ideal performance effect of the DUT is causing the observed performance in the indirect measurements. On the other hand, the data generated by the indirect measurements are generally more closely related to the actually performance parameters of the system as a whole.

In both the direct and indirect measurement methodologies, the goal is to accurately measure the performance parameter and compare that measured value to a system specification or to predict system performance from the measured performance parameter. The sensitivity, dynamic range, and accuracy of such measurements are always of concern to system designers and system manufacturers.

The difficulty that is encountered with many measurement systems used to perform the direct and indirect measurements of device performance is that the measurement systems used to perform the measurements often exhibit inherent non-linear and/or spurious performance characteristics themselves. The inherent non-ideal performance of the measurement systems can limit the dynamic range and accuracy of the tests being performed.

For example, a pair of signal generators used in a two-tone test may generate spurious harmonic signals in the frequency range of the intermodulation product that is being measured. The presence of these spurious signals can limit the minimum level of a given intermodulation product that can be measured by the measurement system. Pre-amps and detectors used in the measurement system can have non-linear performance characteristics that produce spurious signals that interfere with the intended measurements. At the very least, it may be difficult or impossible to make accurate measurements of the amplitude or power level of small or very small signals in the presence of a large, linear response signal.

These inherent, non-ideal characteristics of the measurement system mean that the sensitivity or minimum level of the measurements taken therewith is instrument-limited. The ideal situation is to have measurements that are DUT-limited instead of instrument-limited since it is the non-ideal characteristics of the DUT that are of interest. The ultimate result of the presence of non-ideal characteristics in the measurement system is an effective limitation in the dynamic range of the measurement system, which thus limits the ability of the system to make accurate measurement of very low-level DUT-related distortion signals.

Figure 1A:
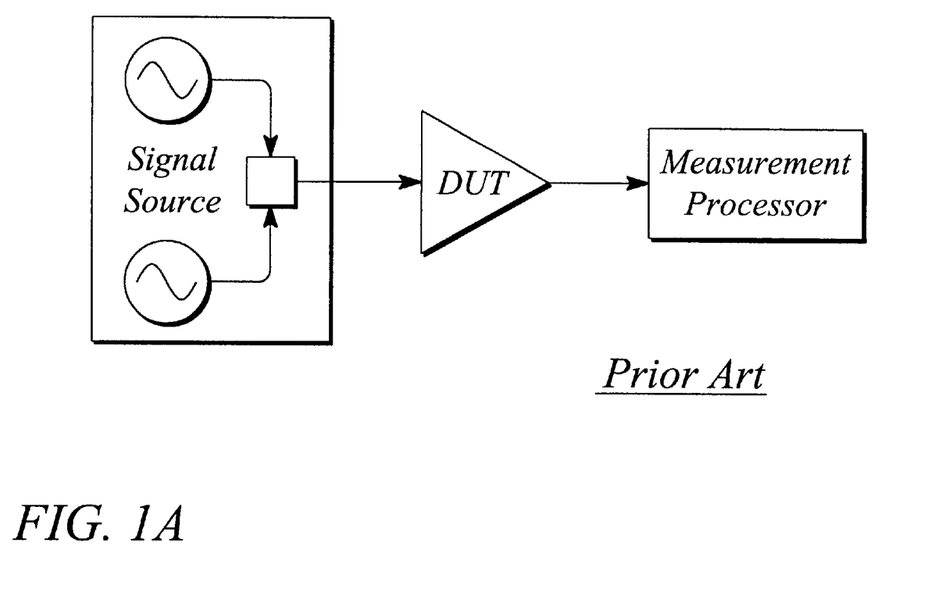
FIG. 1A illustrates a block diagram of a conventional measurement system of the prior art.
Figure 1B:
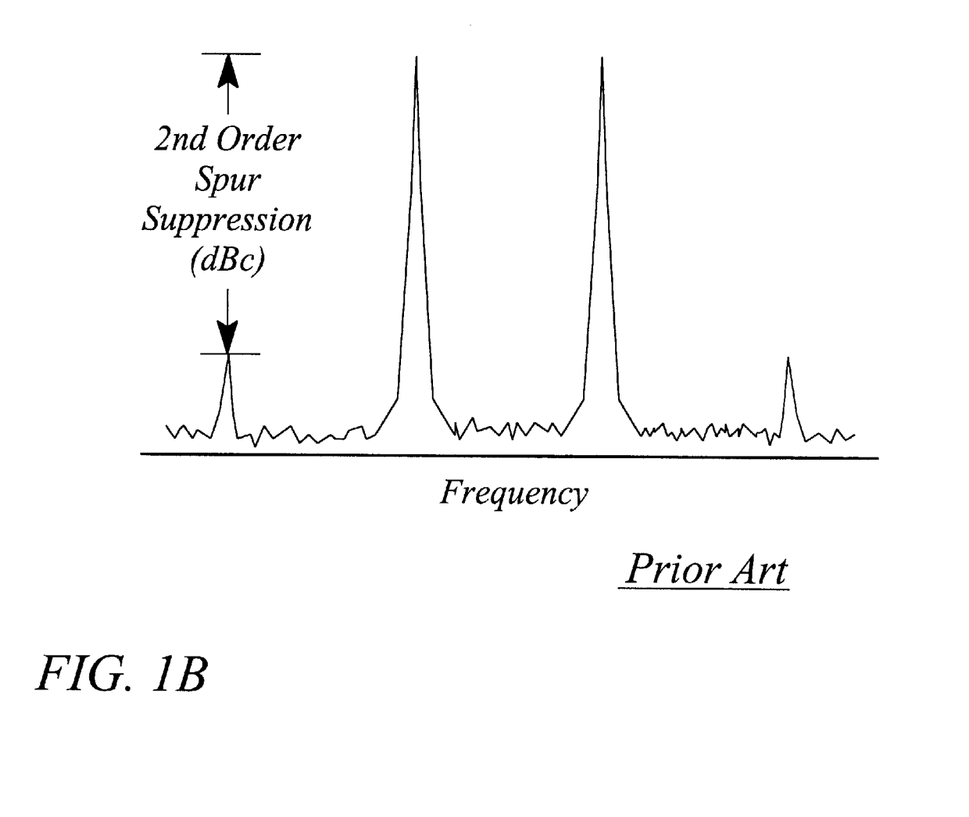
FIG. 1B illustrates a plot of a two-tone measurement result of the system of FIG. 1A.

FIG. 1A illustrates a block diagram of a conventional measurement system that can be used for either direct or indirect measurements. The measurement system comprises a signal source and a measurement processor. The device under test (DUT) is connected between the signal source and the measurement processor. The signal source produces a test signal. The test signal is applied to the DUT. The measurement processor receives and processes the signal after it passes through the DUT. Examples of typical signal sources include voltage controlled oscillators, signal synthesizers, and arbitrary waveform generators. Typical measurement processors include power meters, oscilloscopes, and spectrum analyzers. FIG. 1B illustrates a typical result from a two-tone measurement. While the block diagram illustrated in FIG. 1A depicts a transmission measurement of the DUT, one skilled in the art would readily recognize that with minor modifications, a similar measurement system could be used for reflection measurements as well.

Accordingly, it would be advantageous to have an apparatus and method that compensated for the non-ideal characteristics of the measurement system elements. In particular, it would be advantageous to have an apparatus and method that could facilitate measuring very small spurious signal levels without or with less interference from the linear response signal and spurious signals from the signal source. Such an apparatus and method would extend the dynamic range of existing measurement systems, facilitating low-level distortion measurements and improving the accuracy of the measurement performed therewith. Such a dynamic range extension apparatus and method would solve a long-standing need in the areas of communications and signal transmission system device test, measurement and characterization.

SUMMARY OF THE INVENTION

The present invention is a novel dynamic range extension apparatus and method that compensate for the non-ideal characteristics of measurement system elements that can interfere with measurements of a device under test. In particular, the dynamic range extension apparatus and method of the present invention facilitate low-level distortion measurements of the device under test and improves the accuracy of such measurements using a novel cancellation signal approach.

In one aspect of the present invention, a dynamic range extension apparatus is provided. The dynamic range extension apparatus extends the dynamic range of measurements performed on the device under test. The dynamic range extension apparatus of the present invention has an input port for accepting an input test signal from a signal source and an output port for delivering an output signal to a measurement processor. The apparatus further comprises a signal splitter having an input and two outputs. The apparatus still further comprises a cancellation path having an input connected to a first output of the signal splitter and a test path having an input connected to a second output of the signal splitter. The apparatus yet further comprises a signal combiner having a first input connected to an output of the cancellation path, a second input connected to an output of the test path and an output. The signal splitter is located between the input port of the apparatus and the inputs of the test and cancellation paths. The signal combiner is located between the outputs of the test and cancellation paths and the output port of the apparatus. The device under test is inserted in the test path during a measurement cycle.

In the dynamic range extension apparatus of the present invention, a signal from the source is split by the signal splitter into two signals, a first split signal passes through the cancellation path and a second split signal passes through the test path. The first split signal, or cancellation signal, is phase shifted by the cancellation path. The second split signal, or test signal, passes through the device under test producing a response signal that includes a main or linear response portion or signal and a distortion portion or signal. The response signal is attenuated in the test path where the attenuation is approximately equal to a gain in the device under test. At the outputs of the cancellation path and the test path, respectively, the cancellation signal and the attenuated response signal are combined by the signal combiner prior to being delivered to the measurement processor. Advantageously, the cancellation signal cancels or removes some or all of the linear response portion of the response signal while leaving the distortion portion of the response signal. By canceling the linear response signal, the present invention can reduce the dynamic range requirements of the measurement processor. Moreover, some or all of any non-ideal spurious signals present in the input test signal from the signal source are also cancelled by the cancellation signal upon signal combining.

In another aspect of the present invention, a method of extending a dynamic range of a measurement performed on a device under test is provided. The method comprises the step of splitting an input test signal into a first signal and a second signal. The first signal enters a cancellation path where it is phase shifted to produce a cancellation signal. The second signal enters a test path where it is applied to the device under test to produce a response signal containing a main or linear response portion or signal and a distortion response portion or signal. The response signal is then attenuated. The method further comprises the step of combining the cancellation signal and the attenuated response signal to produce an output signal. The step of combining the cancellation signal with the attenuated response signal results in the output signal in which the main or linear response portion is largely cancelled, or at least greatly reduced in level, while advantageously, the distortion response portion is relatively unaffected. Thus, the low-level distortion response signal of the device under test can be more readily measured using the method of the present invention.

In yet another aspect of the present invention, a measurement system having extended dynamic range and improved measurement accuracy for measurements of low-level distortion signals produced by a device under test is provided. The measurement system comprises a signal source for producing an input test signal, an apparatus for extending dynamic range, and a measurement processor for processing an output signal from the apparatus. The dynamic range extension apparatus has an input port and an output port. An output of the signal source is connected at the input port of the apparatus and an input of the measurement processor is connected at the output port of the apparatus. The apparatus comprises a signal splitter having an input and two outputs. The apparatus further comprises a cancellation path having an input connected to the first output of the signal splitter and a test path having an input connected to the second output of the signal splitter. The apparatus still further comprises a signal combiner having a first input connected to an output of the cancellation path, a second input connected to an output of the test path and an output. The apparatus for extending dynamic range receives the input test signal from the signal source and the signal splitter splits the signal into two signals. A first split signal passes through the cancellation path and a second split signal passes through the test path, where the device under test is inserted for measurement. The second split signal is applied to the device under test in the test path. The device under test produces a response signal that is attenuated at the output of the test path. The first split signal is phase shifted to produce a cancellation signal at the output of the cancellation path. The cancellation signal and the attenuated response signal from the test path are combined in the signal combiner to produce an output signal at the output port of the apparatus. The output signal from the apparatus is received by the measurement processor. The measurement processor accepts the output signal and measures the low-level distortion signals within the output signal.

The dynamic range extension apparatus, method and system of the present invention are capable of broadband operation. A prototype apparatus and system have been constructed with a nominal frequency range of DC –8 GHz. However, there is no limitation to such a frequency range with the present invention. Moreover, advantageously, the dynamic range extension apparatus, method and system can obviate the need for high performance signal sources and high performance measurement processors (e.g., spectrum analyzers) while still allowing high accuracy, high dynamic range measurements to be performed.

BRIEF DESCRIPTION OF THE DRAWINGS

The various features and advantages of the present invention may be more readily understood with reference to the following detailed description taken in conjunction with the accompanying drawings, where like reference numerals designate like structural elements, and in which.

MODES FOR CARRYING OUT THE INVENTION

The present invention is a novel apparatus and method for extending the dynamic range of measurement systems, particularly those systems used for the measurement and characterization of devices used in communications and related signal transmission systems. The dynamic range extension (DRE) apparatus, system and method of the present invention use a feed-forward approach to remove some or all of a linear response signal from a response signal generated by passing a test signal through a device under test (DUT). By removing or partially removing the linear response signal, the apparatus, system and method of the present invention facilitate accurate measurements of extremely small spurious signals or distortions generated by the DUT. These distortions in many cases are undetectable or at least hard to discern in the presence of the linear response signal. In addition, some or all of various spurious signals generated by a signal source and by other elements used in the measurement system are removed by the apparatus and method of the present invention, further improving the measurement accuracy. The present invention, by virtue of its removal or partial removal of interfering signals from the DUT response signal, effectively extends the dynamic range of a given measurement system.

Figure 2:
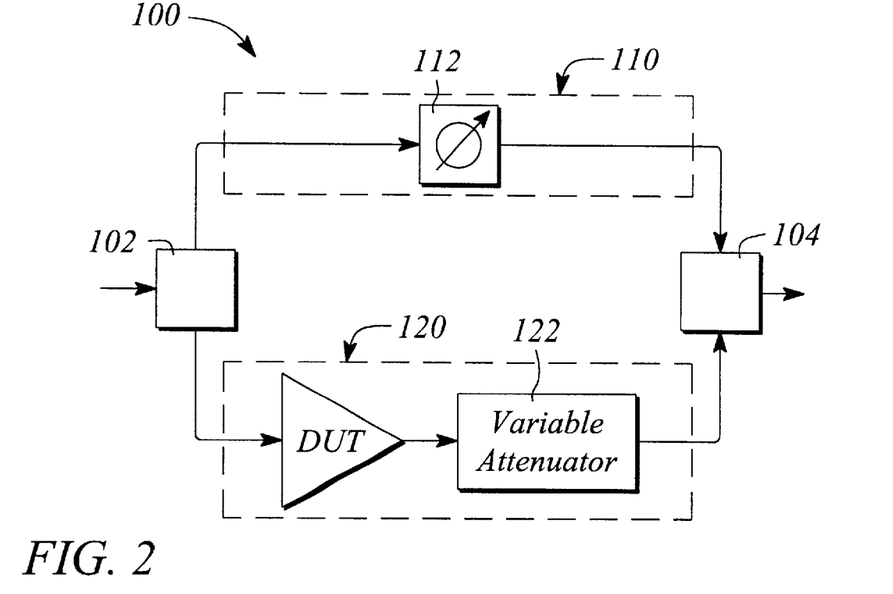
FIG. 2 illustrates a block diagram of a dynamic range extension apparatus of the present invention with a device under test inserted therein.

FIG. 2 illustrates a block diagram of a dynamic range extension (DRE) apparatus 100 of the present invention. The DRE apparatus 100 comprises a signal splitter 102, a signal combiner 104, a cancellation path 110 and a test path or DUT path 120. The cancellation path 110 is a signal path connecting a first output of the signal splitter 102 to a first input of the signal combiner 104. The DUT path 120 is a signal path connecting a second output of the signal splitter 102 to a second input of the signal combiner 104.

Preferably, the signal splitter 102 is a passive, in-phase, equal power divider and the signal combiner 104 is a passive, in-phase, equal power combiner. More preferably, the signal splitter 102 is either a 3 dB power divider or a 6 dB power divider and the signal combiner is either a 3 dB power divider or a 6 dB power divider. The choice of whether to use a 3 dB power divider or a 6 dB power divider for either the signal splitter 102 or the signal combiner 104 is largely dependent on the DUT and the measurement being performed. In general, a 3 dB power divider is preferred for the signal splitter 102 when the DUT must be driven using a large, low-distortion test signal. Similarly, a 3 dB power divider is preferred for the signal combiner 104 when sensitivity of the measurement is of paramount importance. Alternatively, a 6 dB power divider may be preferred for use as the signal splitter 102 when the DUT requires a good input impedance match. In addition, 6 dB power dividers often exhibit a wider operational frequency range than 3 dB dividers and therefore, may be preferred in some instances. One skilled in the art would readily be able to choose between a 3 dB power divider and a 6 dB power divider for the signal splitter 102 and the signal combiner 104 without undue experimentation. Additionally, one skilled in the art would readily recognize a number of functionally equivalent devices to the signal splitter 102 and signal combiner 104 that could be used in the DRE 100. All of these functionally equivalent devices are considered to be within the scope of the present invention.

Figure 3:
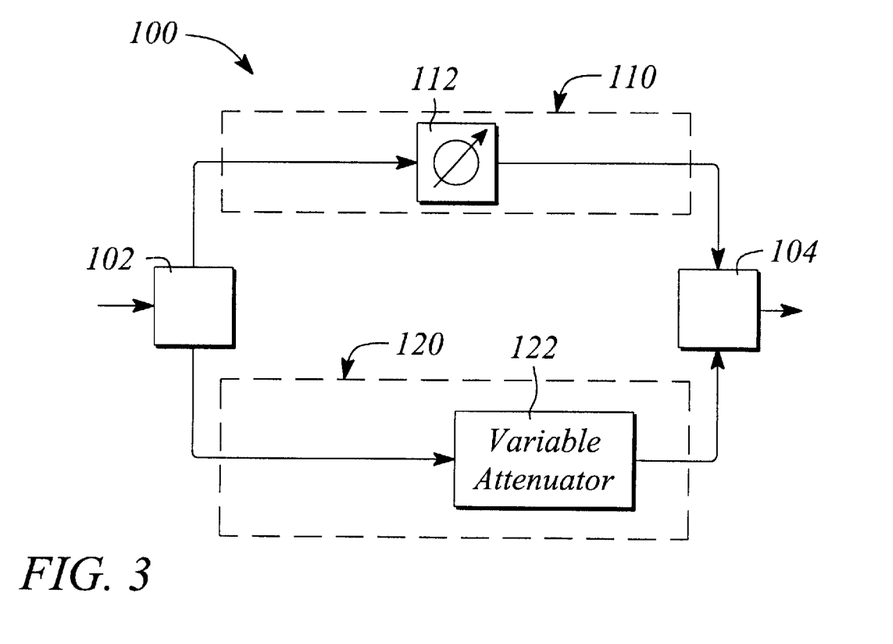
FIG. 3 illustrates a block diagram of a dynamic range extension apparatus of FIG. 2 without the device under test inserted therein.

The DUT path 120 comprises an attenuator 122. Preferably, the attenuator 122 is a variable attenuator or stepped attenuator 122 having an adjustable attenuation range. The adjustable attenuation range of the attenuator 122 has a maximum value that is preferably equal to or exceeding an expected linear response gain of the DUT. The DUT is inserted in the DUT path 120 at a point preceding the attenuator 122 during a test. The cancellation path 110 comprises a phase shifter 112. Preferably, the phase shifter 112 is variable and can be set to provide a nominal phase shift value or electrical length for the cancellation path 110 of 180 degrees at a center frequency of operation of the DUT. The DUT can be removed and replaced by a low loss jumper for measurement system calibration as depicted in the block diagram illustrated in FIG. 3. During a calibration, the attenuator 122 is either removed and a jumper inserted or is set to a 0 dB attenuation level.

When used in a measurement system, the input of the DRE 100 is connected to a signal source while the output of the DRE 100 is connected to a measurement processor. In this embodiment of the DRE 100, the input of the DRE 100 is the input of the signal splitter 102 and the output of the DRE 100 is the output of the signal combiner 104. The signal source produces an input signal S. The input signal S passes through the DRE 100 and the resulting signal is received and processed (i.e. measured) by the measurement processor.

In operation, the input signal S produced by the signal source is applied to the input of the DRE 100. The signal S is split into a pair signals St and Sc. Preferably, the two signals St and Sc are in-phase, equal power replicas of each other. In the cancellation path 110, the signal Sc is phase shifted or phase delayed by 180 degrees at a center frequency fs of the signal S as a result of passing through the phase shifter 112, thereby becoming a phase shifted signal Sc* which enters the signal combiner 104. The test signal St passes through the DUT and the attenuator 122, becoming the distorted test signal St*. In the test path 120, the signal St* includes a linear response signal proportional to St and a non-linear or distortion response signal Sd. The non-linear response signal Sd comprises all of the spurious signals generated by the non-linearities of the DUT. The signal St* is combined with the phase shifted signal Sc* in the combiner 104. The combined signal (Sc*+St*) is then measured by the measurement processor. By combining signals Sc* and St*, some or all of the linear response signal portion of St* is removed or cancelled leaving a signal largely proportional to the distortion response signal Sd.

By way of explanation, consider a signal S that is a sinusoid with a single frequency fs. If the signal S is applied to the DRE 100 of the present invention, the phase shifted signal Sc* will be given by $$Sc^* = -S = -St \quad (1)$$

Similarly, St* will be given by:

$$St^* = (St \cdot G_{DUT} + Sd) \div G_{attn} \quad (2)$$

where $G_{DUT}$ is the linear gain of the DUT and $G_{attn}$ is the attenuation of the attenuator and Sd is a distortion signal produced by the DUT. If the attenuation $G_{attn}$ of the attenuator 122 is set equal to the gain $G_{DUT}$ of the DUT, the output signal So at the output of the DREI 100 is given by $$So = St^* + Sc^* = (St \cdot G_{DUT} \div G_{attn}) + (Sd \div G_{attn}) - St = Sd \div G_{attn} \quad (3)$$

As shown by equation (3), the result of the DRE 100 operation on an input signal S is the complete cancellation of the linear signal (St..$G_{DUT}$) leaving the output signal So that is proportional to the distortion signal Sd of the DUT. Advantageously, the non-ideal signal components found in the input signal S are common to both St* and Sc* and will therefore, tend to cancel out as well.

If, as in many real world tests, the signal S is not a single frequency sinusoid, the equality of equation (1) is replaced by an approximation. Since, in this case, Sc* is only approximately equal to −St, only partial cancellation of the linear response signal will result. However, advantageously even some cancellation of the linear response signal will improve the dynamic range of the measurement. Thus, the DRE 100 of the present invention is useful for a wide variety of narrow to wideband measurements including but not limited to ACPR.

Figure 4:
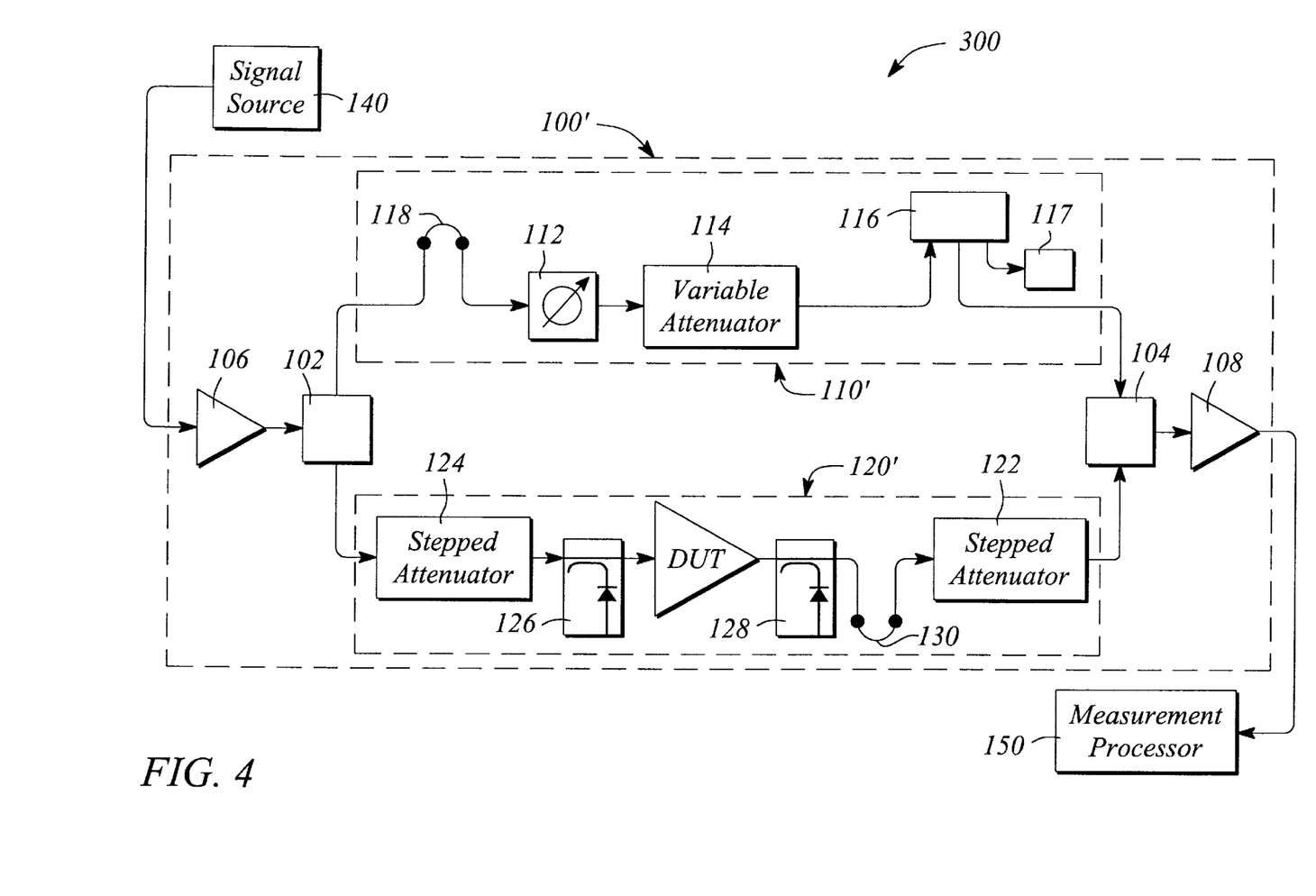
FIG. 4 illustrates a block diagram a measurement system and a preferred embodiment of the dynamic range extension apparatus of the present invention.

FIG. 4 illustrates a preferred embodiment of the DREI 100' of the present invention in the measurement system 300 of the present invention. For the invention, the measurement system 300 comprises a signal source 140, the DRE 100, 100', and a measurement processor 150. The signal source 140 can be any means of generating an appropriate input signal for a given test of the DUT, including but not limited to a microwave signal generator, a synthesizer, or an arbitrary waveform generator. The measurement processor 150 may be any means for measuring a DUT appropriate for a given test, including but not limited to a power meter, a bit error rate tester, and a spectrum analyzer.

The DRE 100' of the preferred embodiment comprises a signal splitter 102 and a signal combiner 104, as in the DRE 100, and further comprises a preamp 106, a cancellation path 110', a DUT path 120', and a low noise amplifier (LNA) 108. The preamp 106 is connected between the input port of the DRE 100' and the input of the signal splitter 102. The LNA 108 is connected between the output of the signal combiner 104 and the output port of the DRE 100'.

For the DRE 100', preferably the preamp 106 is a power amplifier. A power amplifier, as is well known to one skilled in the art, is an amplifier designed specifically for producing high power levels with minimum distortion at its output port. The preamp 106 compensates for system losses and allows the DUT to be driven by a higher level signal than might be possible for a given signal source 140. The LNA 108 is used to lower the noise figure (NF) of the measurement processor 150. Reducing the NF of the measurement processor 150 lowers the noise floor associated with the measurements and helps to increase the dynamic range of the measurement.

The cancellation path 110' comprises the elements of the cancellation path 110 and further comprises an attenuator 114 and a switch 116. An input of the attenuator 114 is connected to an output of the phase shifter 112. An output of the attenuator 114 is connected to an input of the switch 116. An output of the switch 116 is connected the first input to the signal combiner 104. The switch 116 either passes a signal from its input to its output ("on") or blocks passage of the signal ("off").

Preferably, the phase shifter 112 is a mechanical phase shifter also known as a line stretcher. The use of a mechanical phase shifter 112 is desirable since such a phase shifter is passive and therefore, does not contribute to or generate any spurious signals or distortions.

The attenuator 114 is preferably a variable attenuator. More preferably, the variable attenuator 114 is a variable mechanical attenuator since such passive devices do not exhibit strong non-linear behavior at conventional measurement power levels. Advantageously, mechanical attenuators are also known to be a very stable and repeatable means for introducing attenuation in a signal path. Moreover, the variable attenuator 114 preferably has a continuously adjustable attenuation value ranging from approximately 0 dB to 3 dB. A variable attenuator 114 with an attenuation range of 0 dB to 1 dB can also be used. The variable attenuator 114 is used to provide fine amplitude control of the cancellation signal Sc*.

Preferably, the switch 116 is either a single pole single throw (SPST) switch or a single pole double throw (SPDT) switch. In an embodiment using an SPST switch 116, it is preferable that a matched switch be used. A matched switch is one that has internal matching elements for its input and output such that a good impedance match is maintained at both the input and output regardless of whether the switch is "on" or "off".

In the preferred embodiment illustrated in FIG. 4, the switch 116 is an SPDT switch having a first switched port corresponding to the input of switch 116 and having a common port corresponding to the output of switch 116. Moreover, in the preferred embodiment using the SPDT switch 116, the cancellation path 110' further comprises a matched load 117. The matched load 117 is connected to a second switched input port of the SPDT switch 116. More preferably, the SPDT switch 116 is a matched switch having an internal impedance-matched load that terminates any unconnected ports.

When the SPDT switch 116 is "on", a connection is made and a signal path exists between the first switched port and the common port. When the SPDT switch 116 is "off" a connection is made and a signal path exists between the second switched port and the common port. Therefore, when the SPDT switch 116 is "off", signals are prevented from passing through the cancellation path 110' and the first input of the signal combiner 104 is presented with a matched impedance load. The "on/off" functionality provided by the switch 116 is useful during a calibration.

Preferably, the cancellation path 110' also includes an external time delay compensation jumper 118 for adding additional components such as an additional phase shifter (not shown) or a length of transmission line to the cancellation path 110'. The jumper 118 is primarily used to enable lengths of transmission line to be added to the cancellation path 110' such that both the test path 120' and the cancellation path 110' have approximately equal electrical lengths excluding the effects of the phase shifter 112. Adding a section of transmission line in place of the jumper 118 facilitates measuring remotely located DUTs. An example of a remotely located DUT is a wafer probing system in which long cables are typically used to connect the DUT to the test path 120'.

One skilled in the art will recognize that the same functionality provided by the cancellation path 110' described hereinabove can be achieved by a number of means and/or element combinations. In particular, the order of the elements that make up the cancellation path 110' is not critical. Therefore, all permutations of the relative order of the phase shifter 112, attenuator 114 and switch 116 are considered to be within the scope of the present invention. Element functionality may be realized using several devices in place of one or more of the elements of the cancellation path 110' described hereinabove. For example, two attenuators, one preceding and one following, the phase shifter 112 could replace and be functionally equivalent to the attenuator 114. These alternate configurations of the cancellation path 110' can be used without changing the overall functionality or operation of the cancellation path 110' and are within the scope of the invention.

Moreover, it should be noted that as an alternative, the attenuator 114 could be located in the test path 120' instead of the cancellation path 110' and still be within the scope of the present invention. The attenuator 114 is preferably located in the cancellation path 110' since that location minimizes the affect that the attenuator 114 has on measurement system sensitivity. Additionally, locating the attenuator 114 in the cancellation path 110' minimizes the detrimental effect that attenuator mismatch (poor attenuator 114 VSWR) may have on the DUT and the measurement thereof.

A signal Sc entering the cancellation path 110' from the signal splitter 102 passes through the jumper 118 and enters the phase shifter 112. The phase shifter 112 adds a phase shift or phase delay to the signal Sc. The phase shifted signal then passes through the attenuator 114 and emerges as the signal Sc*. In the "on" state, the switch 116 is configured to allow passage of signals from the input to the output, such that the signal Sc* passes on to the first input port of the signal combiner 104. In the "off" state, the switch 116 blocks the passage of the signal Sc*. Moreover, when the switch 116 is a matched switch, the "off" state results in the signal Sc* being absorbed by the matched load internal to the switch 116. Furthermore, when the switch 116 is the SPDT switch 116 and it is in the "off" state, any signals that may enter the cancellation path 110' from the signal combiner 104 are connected to and will be absorbed by the matched load 117.

The DUT path 120' comprises the attenuator 122 of path 120 described hereinabove (referred to as the 'output' attenuator 122 for DRE apparatus 100'), preferably a stepped attenuator, and further comprises an input attenuator 124, also preferably a stepped attenuator, a first coupled signal detector 126, a second coupled signal detector 128, and in one embodiment, an optional calibration jumper 130. The second output of the signal splitter 102 is connected to an input of the input attenuator 124. An output of the input attenuator 124 is connected to an input of the first coupled signal detector 126. An output of the second coupled signal detector 128 is optionally connected to a first port of the calibration jumper 130 while a second port of the jumper 130 is optionally connected to the input of the output attenuator 122. The output port of the output attenuator 122 is connected to the second input of the signal combiner 104. The DUT is connected between the output of the first coupled signal detector 126 and the input of the second coupled signal detector 128.

Preferably, the input attenuator 124 is a mechanical attenuator. The input attenuator 124 is used to adjust the input power level of the signal St used to drive the DUT. In many cases, the signal source 140 may not be capable of producing signals at an optimal power level or does not possess the capability of varying the signal level produced in a controlled, low distortion manner. The input attenuator 124 accomplishes this task and does so without adding distortion. In the preferred embodiment, the input attenuator 124 comprises a stepped attenuator having a 1 dB attenuation step size. In another embodiment (not shown), the input attenuator 124 comprises a mechanical stepped attenuator 124a that provides 1 dB attenuation steps over a range of 0 to 11 dB and a switched attenuator 124b that provides a selectable 10 dB or zero attenuation. The combination of the stepped attenuator 124a and the switched attenuator 124b provide continuous attenuation range coverage from 0 to 21 dB. One skilled in the art would readily recognize that other attenuation values and configurations of the input attenuator 124 are possible. All such configurations and attenuation values are within the scope of this invention.

The first coupled signal detector 126 is used to monitor the overall power level of signals entering the DUT. The second coupled signal detector 128 is used to monitor the overall power level of signals exiting the DUT. The gain of the DUT can be determined by subtracting the power level measured by the first detector 126 from the power level measured by the second detector 128. Preferably the coupled detectors 126, 128 each comprise a 16 dB directional coupler and a broadband power detector. The directional coupler is oriented so as to sample signals traveling in a forward direction in the DUT path 120' from the signal splitter 102 to the signal combiner 104. The optional jumper 130 allows for the insertion of additional elements, such as an additional attenuator, into the DUT path 120' following the DUT.

Preferably, the output attenuator 122 is a mechanical attenuator. The output attenuator 122 is used to adjust the power level of the signal St* as described hereinabove. As with the input attenuator 124, a mechanical output attenuator 122 accomplishes this task without adding distortion. In the preferred embodiment, the output attenuator 122 comprises a stepped attenuator having a 1 dB attenuation step size. In another embodiment, the output attenuator 122 comprises a stepped attenuator 122a and a switched attenuator 122b (not shown). The stepped attenuator 122a is a mechanical attenuator that provides 1 dB attenuation steps over a range of 0 to 11 dB. The switched attenuator 122b provide a selectable 0 dB or 10 dB attenuation. The combination of the stepped attenuator 122a and the switched attenuator 122b provide continuous attenuation range coverage from 0 to 21 dB. One skilled in the art would readily recognize that other attenuation values and configurations of the output attenuator 122 are possible. All such configurations and attenuation values are within the scope of this invention.

A signal St entering the DUT path 120' from the power splitter 102 passes through the input stepped attenuator 124 wherein it is attenuated by the amount of attenuation selected for in the input attenuator 124. Then, the first coupled detector 126 samples the signal. The signal passes through the DUT, the output of which is the signal St*. The signal St* is then sampled by the second coupled detector 128 after which it optionally passes through the optional calibration jumper 130 and is attenuated by the output attenuator 122. The signal St* having been attenuated then enters the second input port of the signal combiner 104 where it is combined with the cancellation signal Sc* as described hereinabove.

As described hereinabove, ideally for optimum performance the cancellation path 110' and the test path 120' each have approximately the same gain. In other words, the signal passing through the test path 120' is attenuated by an amount equal to the approximate gain of the DUT plus any loss associated with the cancellation path 110' (typically ~1 dB). The attenuation in the test path 120' is provided by the input attenuator 124 and the output attenuator 122, a portion of the attenuation being provided by the input attenuator 124 and the balance of the attenuation being provided by the output attenuator 122. Moreover, the distribution of attenuation between the input attenuator 124 and the output attenuator 122 is often varied during a given measurement.

For example, a measurement such as the ACPR involves sweeping or varying the input power of the input signal S from a low level to a high level. When the input power of the signal S is at a low level, it is preferred that the majority of the attenuation be provided by the input attenuator 124. Having most of the attenuation provided by the input attenuator 124 minimizes the effect that the attenuation has on the distortion signal Sd in the DUT output signal St* and minimizes the noise figure as seen by the measurement processor 150, thereby maximizing measurement sensitivity. On the other hand, when the input power of the signal S is at high levels, it is preferred that the output attenuator 122 provides the majority of the attenuation. Having most of the attenuation provided by the output attenuator 122 minimizes the power level of the signal S that must be generated by the signal source 140 and minimizes the distortion produced by the preamp 106 due to high power levels of the input signal S. Additionally, if the output attenuator 122 provides the majority of the attenuation, there is a reduced chance that the LNA 108 will become saturated and produce distortion products that might obscure distortion products of the DUT.

Transfer of attenuation from the input attenuator 124 to the output attenuator 122 during a power sweep can be gradual or abrupt. That is, at each power level of the signal S, a different amount of attenuation may be apportioned to the two attenuators 124, 122 or the attenuation values of the two attenuators can be changed at one or more predetermined power levels during the sweep.

In the DRE 100', the gain of the DUT is determined using the first coupled detector 126 and the second coupled detector 128. The difference between signal power measured by the second detector 128 and signal power measured at the first detector 126 with the DUT inserted and operating in the test path 120' is approximately equal to the gain of the DUT.

For optimal cancellation performance especially with modulated signals S, the DRE 100' is calibrated prior to inserting a DUT and performing a measurement. As part of the calibration, the coupled detectors 126, 128 are calibrated and a look-up table is generated. The look-up table relates the signal power of the signal S to the measured signal power at each of the detectors 126, 128. To generate the look-up table, readings are recorded at the detector 126 for various power levels of the signal S spanning the total range of power levels of the signal S that are to be used in the measurement. A short section of low loss transmission line is then inserted in place of the DUT and the process of recording readings is repeated for detector 128. Once the look-up table has been generated relating the signal S power level to that measured at the detectors 126, 128, the measurement can be performed.

In addition, it is generally useful to measure and record the power level of the output signal So at the measurement processor 150 with the cancellation path 110' disabled or "broken" ("off"). The cancellation path 110' is disabled by switching the SPDT switch 116 such that the common port of the SPDT switch 116 is connected to the match load 117 instead of being connected to the first switched input port as is the case when the cancellation path 110' is enabled ("on"). This power level information is used during a signal-nulling portion of the measurement described in more detail hereinbelow.

A prototype DRE 100' has been constructed and tested. For the prototype DRE 100', the directional couplers and the detectors of the coupled detectors 126, 128 were 1–26 GHz, 16 dB directional couplers manufactured by Krytar of Sunnyvale, Calif., and HP33330 Coaxial Detectors manufactured by Hewlett-Packard of Palo Alto, Calif., respectively. The LNA 108 comprised three TC205P HBT Series-Shunt (DC-15 GHz) amplifiers with a total gain of between 25 dB and 30 dB, manufactured by the Microwave Technology Center (MWTC) of Agilent Technologies of Palo Alto, Calif. The preamp 106 comprises a TC700 amplifier followed by a TC724 amplifier both of which are manufactured by MWTC.

The measurement system 300 of the preferred embodiment of the present invention used with the prototype DRE 100' comprised a signal source 140 model ES G-D manufactured by Agilent Technologies of Palo Alto, Calif., an HP8565E Spectrum Analyzer manufactured by Agilent Technologies of Palo Alto, Calif., for the measurement processor 150, and a HP34970A Data Acquisition/Switch Unit manufactured by Agilent Technologies of Palo Alto, Calif. was used to monitor the coupled detectors 126, 128.

The ESG-D signal source 140 was adapted to generate a signal S suitable for wideband code division multiple access (W-CDMA) testing. An adjacent channel power ratio (ACPR) measurement was performed on a wideband amplifier model number AH11 manufactured by Watkins Johnson of San Jose, Calif. The ACPR measurements were performed with and without the use of the prototype DRE 100' of the present invention. The results of the measurements are illustrated in FIG. 5 as a plot of measured data.

Figure 5:
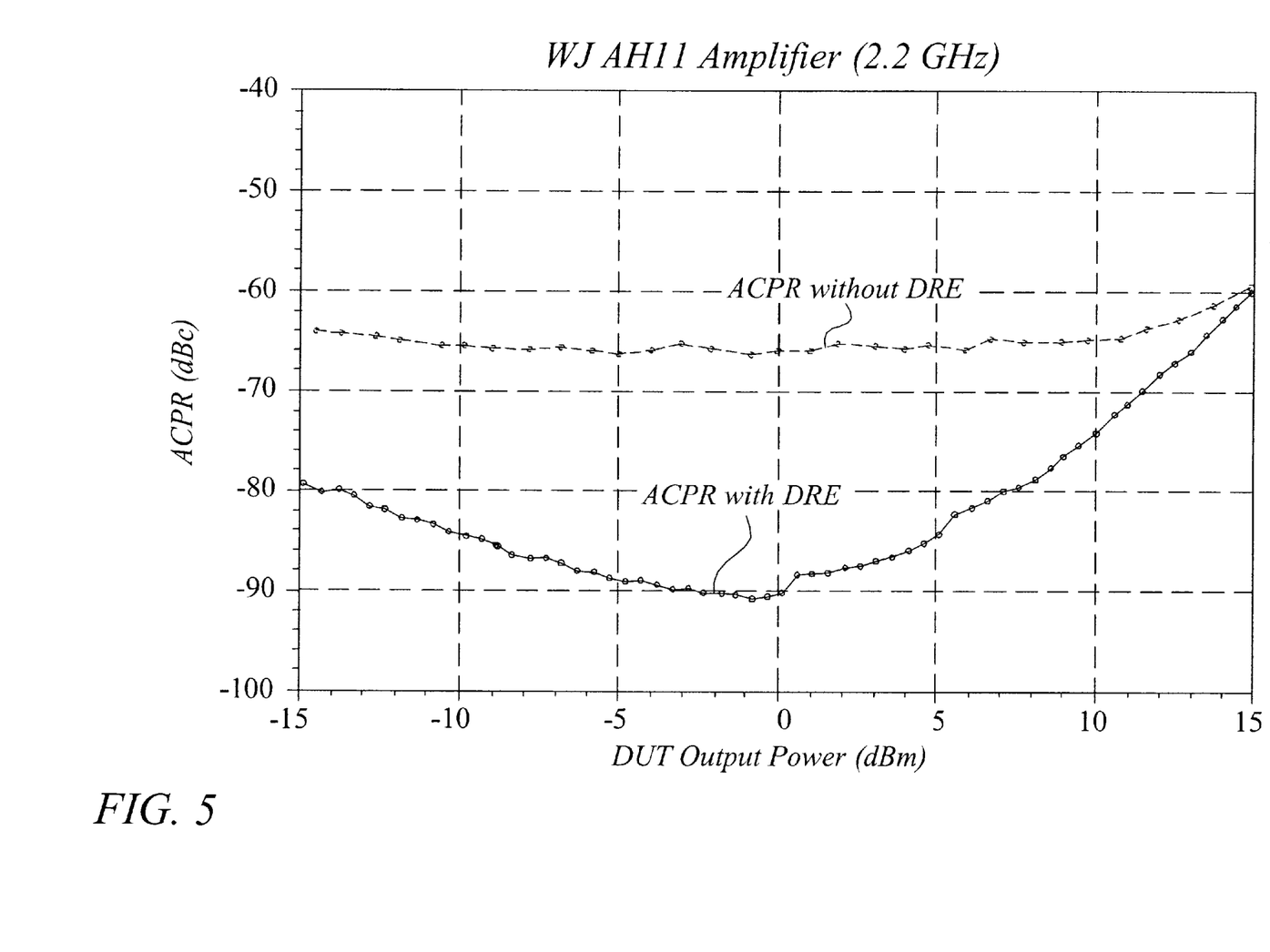
FIG. 5 illustrates a plot of measured results taken for a device under test with a prototype dynamic range extension apparatus and system of FIG. 4.

In FIG. 5 one curve labeled "A CPR without DRE" corresponds to data taken without the use of the DRE 100' of the present invention. A second curve in FIG. 5 labeled "A CPR with DRE" corresponds to ACPR data taken using the prototype DRE 100'. The data taken with the prototype DRE 100' is significantly improved relative to that taken without the DRE 100'. The improvement noted is the result of the increased dynamic range afforded by the use of the DRE 100, 100' of the present invention. In fact, an improvement in dynamic range of greater than 25 dB was achieved in this measurement. Other measurements using the prototype DRE 100' have yielded signal cancellations of greater than 60 dB leading to typical or expected dynamic range improvements of greater than 30 dB.

The full extent of the dynamic range improvement that can be achieved with the use of the DRE 100, 100' depends on a variety of factors including the type of DUT being measured, the measurement being performed, the total bandwidth of the measurement, and the amount of effort expended optimizing the DRE 100, 100' parameters. Dynamic range improvements and cancellations of 40–60 dB have been found to be achievable for even relatively wideband signals.

Figure 6:
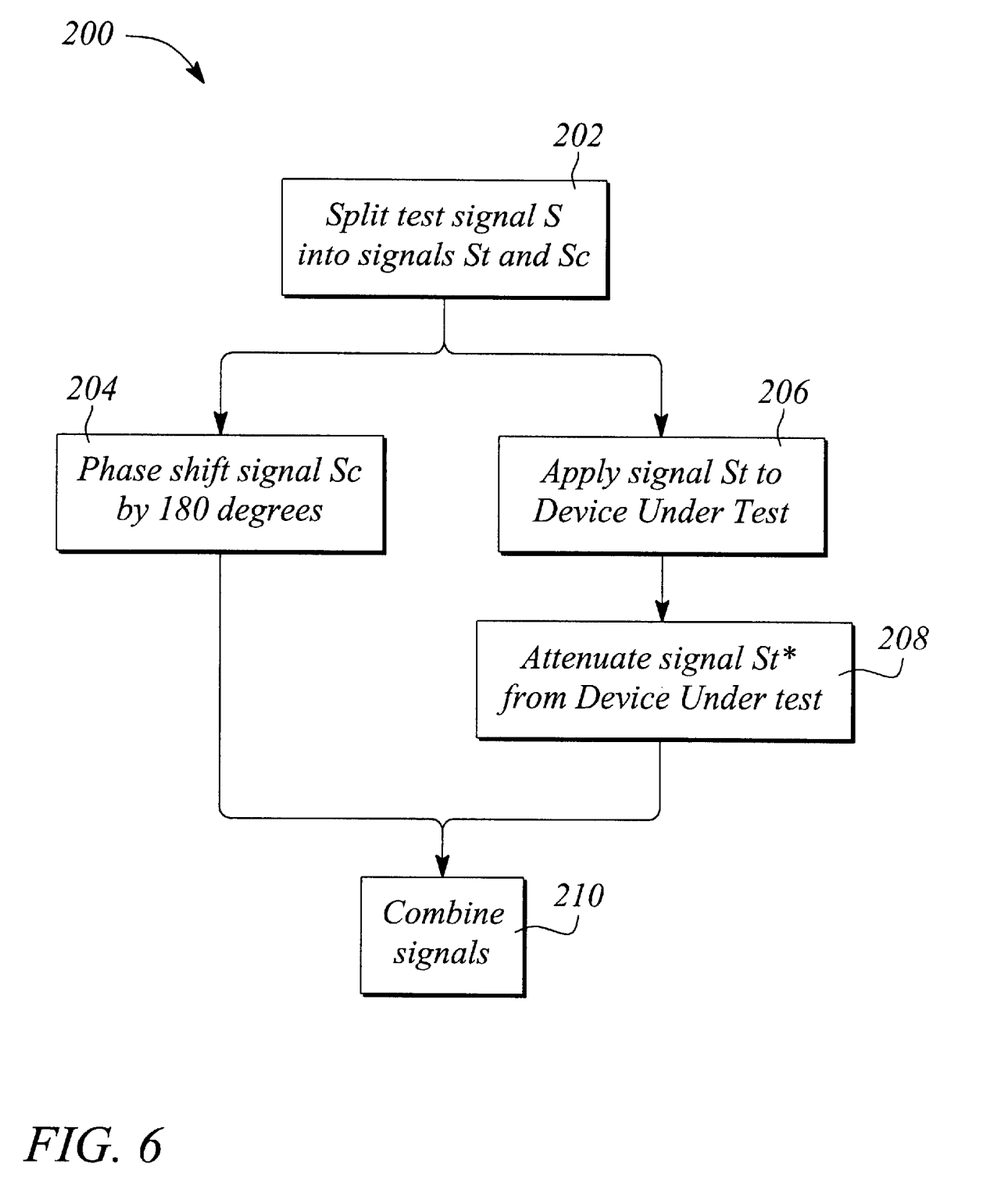
FIG. 6 illustrates a block diagram of a method of dynamic range extension of the present invention.

In another aspect of the present invention, a method 200 of extending the dynamic range of a measurement system for measuring low level signal distortions produced by a DUT is provided. A block diagram of the method 200 is illustrated in FIG. 6.

The method 200 of the present invention comprises the step of splitting 202 an input signal S into a pair of signals St and Sc. As described herein above, the signals St and Sc are preferably equal power, in-phase replicas of each other. The method 200 further comprises the step of phase shifting 204 the signal Sc by 180 degrees to produce a cancellation signal Sc*. The method 200 further comprises the step of applying 206 the signal St to the DUT to produce a signal St* having a linear component and a distortion component; and the step of attenuating 208 the signal St*. The method 200 still further comprises the step of combining 210 the phase shifted cancellation signal Sc* with the attenuated DUT output signal St* to produce an output signal So. The signal So is predominantly the distortion component of the DUT output signal since the step 210 of combining Sc* and St* acts to cancel the linear component of the DUT output signal St*. Advantageously, the step of combining 210 also tends to cancel non-ideal component signals found in the input signal S since these are common to both St* and Sc*.

In a preferred embodiment of the method 200 of the present invention, the method 200 comprises the step of calibrating 212 the measurement system hardware, preferably prior to the step 202 of splitting the input signal. The step of calibrating 212 produces data used to set power levels, attenuation values and to correct measurements to be made on the output signal So. The step of calibrating 212 comprises the step of creating 212a a look-up table. To create the look-up table, a series of signal power levels of the input signal S to be used in a measurement cycle are generated and signal power levels before and after the DUT are measured to produce measured power level data.

The measured power level data from before and after the insertion of the DUT in the test path 120' are, in turn, used to create the look-up table. The look-up table is used in conjunction with measurements taken with the DUT inserted in the measurement system for determining the DUT gain and for determining therefrom the attenuation to be applied during the step of attenuating 208. The step of calibrating 212 further comprises the step of nulling 212b the linear component of the output signal So. The step of nulling 212b comprises adjusting the phase shift of the step of phase shifting 204 and adjusting the attenuation of the step of attenuating 208 to minimize the power level of the linear and other undesirable components of the output signal So. A check to determine whether any component in the measurement system is being overdriven may also be made during the step of calibrating 212.

For example, consider the case where the coupled detectors 126, 128 of the DRE 100' of the present invention are used to measure the signal power levels before and after the DUT. In most cases, the minimum power level detectable by a detector is set by a detector diode noise floor. For many practical wideband detectors the minimum power level is approximately −25 dBm when using a 16 dB coupler as in the present invention. Assume for this example that a maximum power level detectable by the detectors 126, 128 is +20 dBm. A look-up table is generated during the step of calibrating 212 that covers this range of signal levels. Signal levels outside this range are handled by fitting a polynomial function to the measured data from the look-up table and then extrapolating using the fitted function to the desired power level.

Continuing with the example, the look-up table is created by measuring the power detected by each of the detectors 126, 128 for various input signal S power levels. Typically, the power levels are measured by the detectors 126, 128 at 0.25 dB intervals across the total range of input signal S power levels. Larger intervals than 0.25 dB can be used since intermediate values can be computed from the measured data with sufficient accuracy using interpolation. Interpolation has been found to work well with power intervals greater than 1 dB. The measured data are stored in an array in computer memory. Measured data is taken for both the first detector 126 and the second detector 128. An assumption is made that the distortion present in the power levels measured by the second detector 128 does not significantly affect the power level measurement. This is a reasonable assumption since distortion signals of typical DUTs are generally 10 dB to 20 dB below that of the linear components. Since the measurement processor 150 measures distortion signals, generally their levels are referenced back to the DUT output using information about the loss and gain of elements between the DUT and the measurement processor 150 input.

In yet another aspect of the invention, the DRE 100, 100' can be controlled by a computer controller that executes a computer program stored in computer memory. The prototype control program is written using Visual Engineering Environment from Agilent Technologies of Santa Rosa, Calif. (Agilent VEE). This visual programming environment is optimized for instrument control applications. Programming languages, such as C/C++, Visual Basic, or a variety of other programming languages, could be used to implement the functionality of the control program. On skilled in the art would readily recognize without undue experimentation a suitable programming language for implementing the control program.

The control program is adapted for W-CDMA ACPR measurements. However, the software program embodies general procedures that are applicable to a wide variety of applications of the DRE 100, 100' beyond W-CDMA ACPR testing. As such, references to W-CDMA ACPR measurements hereinbelow are merely illustrative and are not meant to limit the scope of the control program or its use with the DRE 100, 100' of the present invention.

The control program, through a host computer input/output interface, functions to set various DRE 100' components such as the SPDT switch 116, the settings of the input attenuator 124, the output attenuator 122, and controls conditions and settings of the signal source 140 and the measurement processor 150. In addition, the control program records data from the measurement being performed and displays the results of the measurement. The program is organized in and provides a step-by-step interactive measurement interface for the user or operator. The basic measurement sequence includes defining desired measurement conditions (e.g. frequencies, power levels, measurement increments, etc), performing necessary calibrations (e.g. coupled detectors), and interacting with the operator to obtain desired signal cancellation through an interactive nulling operation (e.g. setting phase shift and amplitude for optimal linear response cancellation). After the operator has completed these preliminary functions, the operator presses "GO" and the program automatically sets the conditions of the signal source 140, DRE 100' attenuators 124, 122, the measurement processor 150 and other elements to accomplish the measurement. For example, in an ACPR measurement, the program steps through the requested input signal S power levels and presents the computed "result data" as each measurement increment is completed. When the measurement cycle is completed the result data can be stored in files, printed or compared to other stored file data using the program.

The ACPR control program comprises a plurality of user interfaces for inputting user-selected parameters and for viewing measurement results. The control program further comprises algorithms that implement a measurement process including a calibration process that typically precedes an actual measurement.

Figure 7:
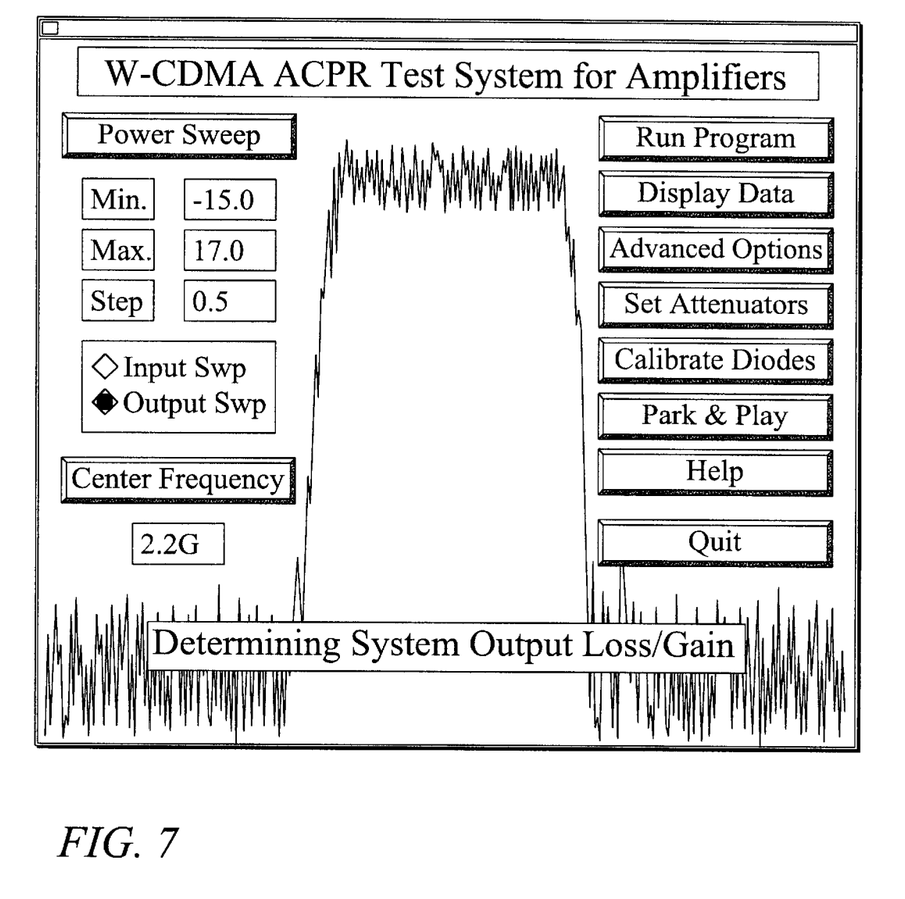
FIG. 7 illustrates a main screen display of a user interface for a control program used in conjunction with the dynamic range extension apparatus of the present invention.

The control program user-selected parameters are embodied in the main screen of a graphical user interface provided by the control program. An example of the main screen entitled 'W-CDMA ACPR Test System for Amplifiers' is illustrated in FIG. 7. The main screen user-selected parameters include inputs such as a power sweep input and center frequency input. The main screen user interface also includes operator controls, such as a 'Run Program' button, a 'Display Data' button, an 'Advanced Options' button, a 'Set Attenuators' button, a 'Calibrate diode' button, a 'Park & Play' button, a 'Help' button, and a 'Quit' button.

The Power Sweep input allows a user to input the power step parameter for the ACPR measurement. The ACPR control program is set up to sweep the input or output power of the DUT by default. The user enters the minimum power, maximum power and power step parameters and indicates whether the parameters correspond to a DUT input or an output power level. The Center Frequency input allows the user to specify the center frequency of a main channel in the ACPR measurement. The VEE software measures the W-CDMA ACPR in a 4.096 MHz bandwidth, which corresponds to a W-CDMA standard channel spacing of 5 MHz. Once the center frequency is specified, upper and the software determines lower adjacent channels. The user is prompted by the control program to confirm that the detectors 126, 128 have been calibrated for the selected center frequency and the specified power levels have been set in the Power Sweep input. Curve fitting is used for power levels and frequencies that do not correspond with entries in the stored calibration table for each detector 126, 128.

In general, extrapolation is used with the data in the calibration tables when measured values from a detector fall outside of the calibration table range. A high order polynomial is curve-fit to the original calibration data and used to estimate power levels in extrapolation. Preferably, the detectors are calibrated across the entire range of anticipated power levels and frequencies. Interpolation is used with the data in the calibration table when the measured value from a detector falls between calibration data points in the table. The interpolated data is computed from a high order polynomial curve-fit to the original calibration data. The user has the option to examine how well the polynomial equation, generated by curve-fitting, fits the data. The Calibrate Diodes button includes a submenu that allows users to view plots of measured vs. calculated responses. If the user has a calibration file that spans their measured power levels, measurement accuracy is very high and is limited more by the measurement processor than by the interpolation of data within the calibration data table.

Pressing the Run Program button initiates a measurement sequence. The Display Data button reads and displays previously measured data from data files stored by the computer control system. Up to six traces or independent data sets can be displayed on a single plot generated by this function. The Advanced Options button allows the user to have somewhat finer control over the way measurements are taken. For example, the user can select whether the upper or lower adjacent channel is used in the ACPR measurements. The upper channel is the default channel.

The Set Attenuator button configures the instruments and allows the user to control the input attenuator 124 and the output attenuator 122. In addition, the Set Attenuator button enables the user to control the SPDT switch 116 and other measurement system 300 components primarily for trouble shooting purposes. The Calibrate Diodes button allows the user to calibrate the detectors 126, 128. The detectors 126, 128 must be power calibrated for each frequency and modulation type. The result of the calibration is stored in an ASCII test file nominally called detector_calibration. txt. The Park & Play button sets up the measurement system elements for a user-specified DUT output power level and displays the ACPR measurement results. This button allows tuning of the DUT for optimal performance. In practice, adjusting or tuning the DUT can degrade the cancellation and hence may corrupt the ACPR measurement. The measurement system 300 automatically attempts to detect when such DUT adjustments might impair measurement accuracy and prompts the user to re-adjust the cancellation before proceeding. The Help button provides the user with some instructional text while the Quit button exits the control program.

Once the Run Program button has been pressed by a user, control program operation begins controlling the DRE 100, 100' and a measurement cycle commences. During the operation, messages are displayed visually on the VEE panel (i.e. user interface display) indicating measurement progress. For example, a message indicating that the system is determining output loss and/or gain is displayed at an appropriate time in the measurement cycle. (e.g. Message: "Determining System Output Loss/Gain"). The control program can also display measurement progress via the measurement processor 150, such as with a spectrum analyzer. The intent of the messages is to keep the user apprised of the measurement progress since some measurement cycles can have a fairly long duration.

The control program operation begins by determining how control lines of input/output attenuators 124, 122 and detectors 126, 128 are configured. The control program then determines the gain of the preamp 106 and LNA 108. An estimate of the DUT gain is then made by the program using, in part, information from the detectors 126, 128 and the program attempts to achieve the nulling of the signal power in the main channel of the W-CDMA ACPR. The term "nulling", as used herein, refers to a process by which the power in a main channel of the W-CDMA ACPR is reduced to a low level, preferably approximately zero, by adjusting the various controllable elements of the DRE 100, 100'.

Figure 8:
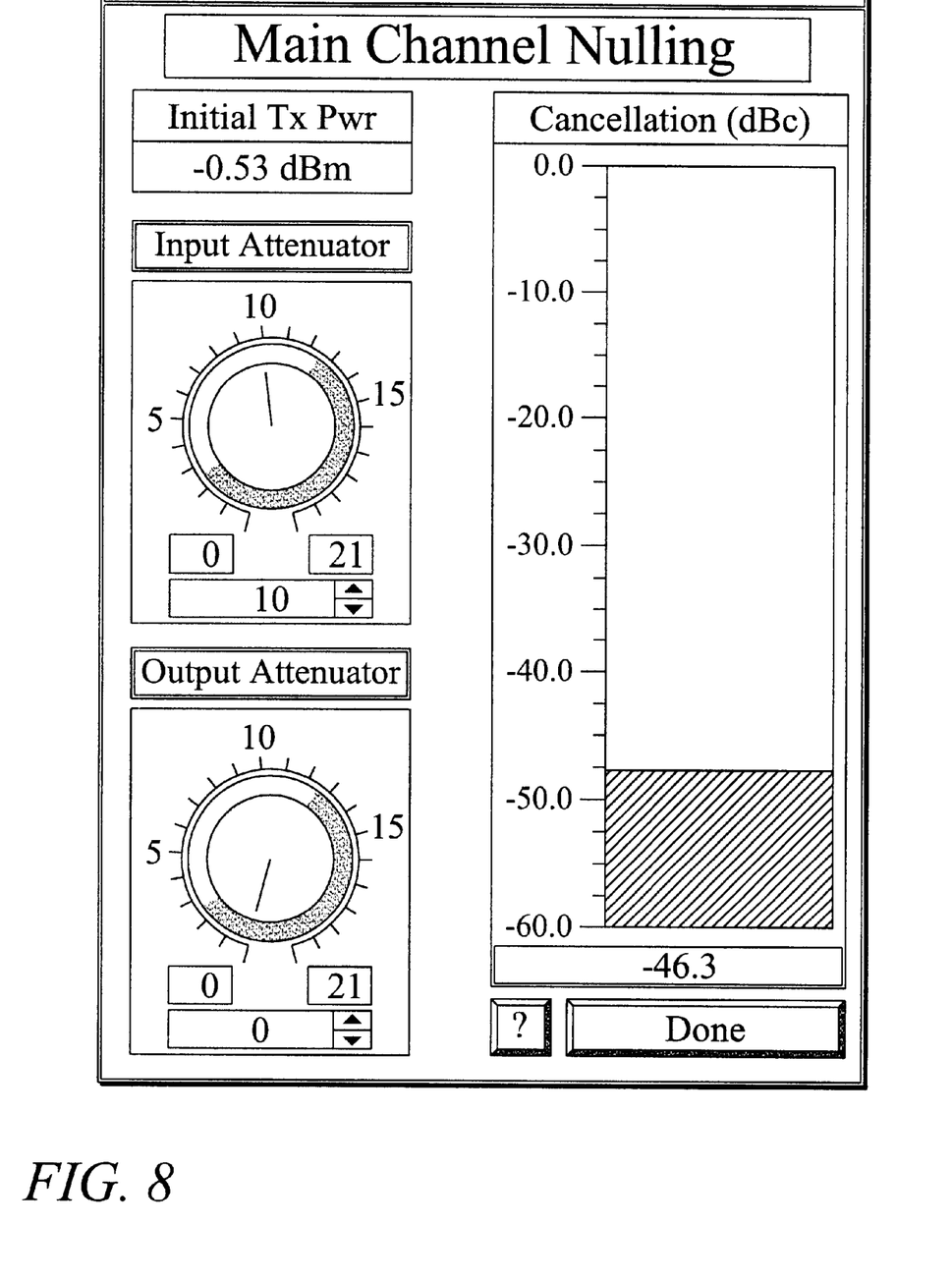
FIG. 8 illustrates a nulling screen display of a user interface for a control program used in conjunction with the dynamic range extension apparatus of the present invention.

After the control program has attempted to null the DUT gain, the user is allowed to fine tune the nulling. A user interface display called a Main Channel Nulling screen is presented to the user enabling the user to adjust the amplitude and phase of the signals in the DUT path 120, 120' and cancellation path 110, 110' in an attempt to improve the nulling. The Main Channel Nulling screen user interface display is illustrated in FIG. 8. The user may either accept the nulling that has been achieved by the program or attempt to improve the nulling using controls provided by the Main Channel Nulling screen.

The Main Channel Nulling screen provides several controls and tools for facilitating manual nulling by the user. The Cancellation meter is a tool provided by the nulling screen that gives an indication of the extent to which the main channel power has been nulled. Colors on the cancellation meter serve as a rough indication to the user of how much effort should be spent on the cancellation. The color red is used to indicate that the cancellation is poor and the resulting measurement results are likely to be poor as well. Yellow on the cancellation meter indicates that in some cases the cancellation or nulling achieved is sufficient while green indicates that in most cases the user has achieved enough cancellation. In addition, there is a message displayed at the top of the cancellation meter each time a "color boundary" is crossed that indicates whether the user should continue attempting to null the main channel signal (carrier) or proceed with the measurement.

Note that the Cancellation meter is only a rough indicator that can be used to guide the manual nulling process and that cancellation or nulling is highly dependent on the DUT. In general, there are two goals in performing nulling or cancellation for ACPR: i) minimize or at least reduce main channel power so that the LNA 108 and/or measurement processor 150 are not overdriven, and ii) attempt to eliminate or at least minimize the contribution of source 140 distortions or spurious signals to the measurement of adjacent channel power. The Cancellation meter is a good indicator of (i) main channel power, but not of (ii) source 140 distortion or spurious signal level. Determination of source 140 distortion cancellation is often accomplished by using the facilities of the measurement processor 150. For example, if a spectrum analyzer is used as the measurement processor 150, the spectrum analyzer display can be used to display a signal spectrum in the adjacent channel. Signal source 140-related distortions can often be detected by viewing the spectrum. The ultimate goal of nulling is to produce a relatively "flat" nulling that removes as much of the main channel power as possible while simultaneously minimizing the source 140 distortions present in the adjacent channel. Typically, 40 to 50 dB of main channel power cancellation is achievable through a combination of automatic and manual cancellation.

Figure 9:
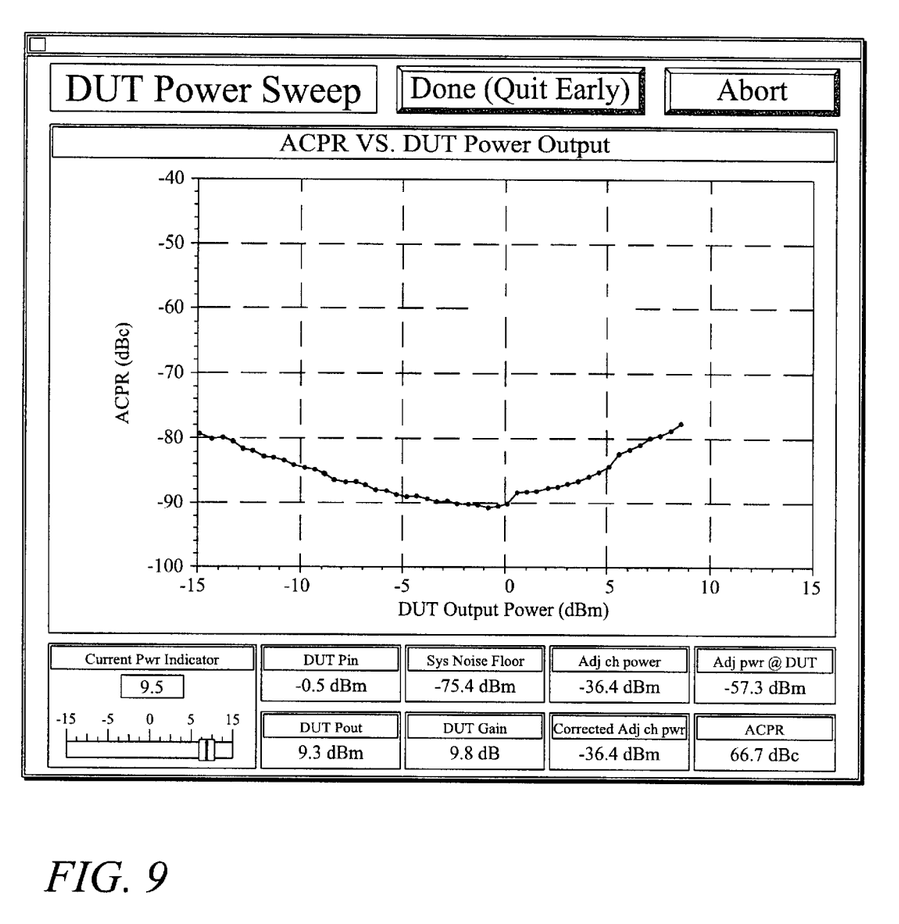
FIG. 9 illustrates a power sweep screen of a user interface for a control program used in conjunction with the dynamic range extension apparatus of the present invention.

The DUT Power Sweep screen of the user interface depicts various aspects of the measurement process and gives the user an indication of progress through the measurement cycle. The DUTPower Sweep screen is illustrated in FIG. 9. A slide meter, e.g. referred to as 'Current Pwr Indicator' in the lower left of the illustration in FIG. 9 indicates measurement cycle progress towards completion. Various measurements taken during the measurement cycle are displayed periodically. A brief description of various displayed parameters is given below.

DUT Pin and DUT Pout indicate DUT input and output power levels, respectively. Note that the indicated power levels may be lower or higher than those actually used by the program and the DRE 100, 100' as a result of extrapolating the calibration file data for the detectors 126, 128. If the program determines that an extrapolation is required, the user is notified. DUT Gain indicates the calculated DUT gain in dB. The displayed DUT Gain is computed from DUT Gain=DUT_Pout−DUT_Pin. The SYS Noise Floor displays a measurement of system noise floor. This parameter is used to correct for measurement errors of low-level signals. Ideally, SYS Noise Floor is much lower than the measured adjacent channel power. SYS Noise Floor is updated as required when the measurement system changes state. For example, the SYS Noise Floor may be updated when the program instructs the measurement processor (e.g. spectrum analyzer) 150 to change its attenuation, reference level, or output attenuators. Adj ch power is the measured adjacent power level including system noise. Corrected Adj ch power is the measured adjacent channel power level corrected for the effects of system noise. Adj pwr @ DUT is the corrected adjacent channel power referenced to the DUT output. ACPR is the DUT ACPR computation computed using equation 4.

$$ACPR=-(DUT\_Pout-Adj\_pwr\_@\_DUT) \quad (4)$$

Whenever the hardware configuration of the DRE 100, 100' or measurement system 300 changes (e.g. input attenuation is switched to output attenuation), the user is prompted to readjust the phase and amplitude to achieve maximum signal nulling.

Thus there has been described a novel dynamic range extension apparatus 100, 100' and method 200 for a measurement system and a measurement system 300 incorporating the apparatus 100, 100' and method 200. It should be understood that the above-described embodiments are merely illustrative of the some of the many specific embodiments that represent the principles of the present invention. Clearly, those skilled in the art can readily devise numerous other arrangements without departing from the scope of the present invention.

What is claimed is:

1. An apparatus for extending the dynamic range of measurements performed on a device under test, the apparatus having an apparatus input port that accepts an input signal from a source and an apparatus output port that delivers an output signal to a measurement processor, the apparatus comprising:

a signal splitter having a splitter input, a first splitter output and a second splitter output;

a cancellation path having a cancellation input connected to the first splitter output of the signal splitter and a cancellation output;

a test path having a test input connected to the second splitter output of the signal splitter and a test output, the test path providing for the insertion of the device under test; and a signal combiner having a first combiner input connected to the cancellation output of the cancellation path, a second combiner input connected to the test output of the test path and a combiner output, wherein the signal splitter is located between the apparatus input port and the cancellation and test inputs, and wherein the signal combiner is located between the cancellation and test outputs and the apparatus output port.

2. The apparatus of claim 1, wherein the cancellation path comprises a phase shifter between the cancellation input and the cancellation output.

3. The apparatus of claim 2, wherein the test path comprises an output attenuator between the device under test and the test output of the test path.

4. The apparatus of claim 1, further comprising:

a preamplifier between the apparatus input port and the signal splitter; and a low noise amplifier between the signal combiner and the apparatus output port.

5. The apparatus of claim 2, wherein the cancellation path further comprises an attenuator between the cancellation input and the cancellation output.

6. The apparatus of claim 5, wherein the attenuator is a mechanical variable attenuator.

7. The apparatus of claim 2, wherein the cancellation path further comprises a switch between the cancellation input and the cancellation output.

8. The apparatus of claim 2, wherein the cancellation path further comprises a time delay jumper between the cancellation input and the cancellation output that provides for insertion of additional components into the cancellation path.

9. The apparatus of claim 3, wherein the test path further comprises an input attenuator between the test input of the test path and the device under test.

10. The apparatus of claim 9, wherein the input attenuator and the output attenuator are mechanical step attenuators.

11. The apparatus of claim 3, wherein the test path further comprises a first coupled detector between the test input and the device under test and a second coupled detector between the device under test and the test output, the first coupled detector and the second coupled detector detect signal power levels at an input and an output of the device under test, respectively.

12. A method of extending a dynamic range of a measurement performed on a device under test comprising the steps of:

splitting an input signal into a first signal and a second signal;

phase shifting the first signal to produce a cancellation signal;

applying the second signal to the device under test to produce a response signal having a main portion and a distortion portion;

attenuating the response signal; and combining the cancellation signal and the response signal to produce an output signal comprising the distortion portion.

13. The method of claim 12, wherein in the step of combining, the cancellation signal cancels out the main portion of the response signal.

14. The method of claim 12, wherein the first signal and the second signal are in-phase, equal power replicas of each other.

15. The method of claim 12, wherein the step of attenuating further comprises determining an approximate gain of the device under test.

16. The method of claim 12, further comprising the step of calibrating power levels, phase shift and attenuation prior to the step of phase shifting and the step of attenuating.

17. The method of claim 16, wherein the step of calibrating comprises the steps of:

creating a look-up table from signal power levels generated before and after the device under test;

nulling a linear component of the output signal.

18. The method of claim 17, wherein the step of nulling comprises the steps of:

adjusting the phase shift; and adjusting the attenuation.

19. A measurement system having extended dynamic range and improved measurement accuracy for measurements of low-level distortion signals produced by a device under test, the measurement system comprising:

a signal source that produces an input signal;

a measurement processor that performs a measurement of low-level distortion signals within an output signal; and a dynamic range extension apparatus between the signal source and the measurement processor, the apparatus having an apparatus input port to receive the input signal and an apparatus output port to provide the output signal, wherein the apparatus produces a cancellation signal that cancels a portion of a response signal produced by the device under test.

20. The measurement system of claim 19, wherein the dynamic range extension apparatus comprises:

a signal splitter having a splitter input, a first splitter output and a second splitter output;

a cancellation path that produces the cancellation signal, the cancellation path having an cancellation input connected to the first splitter output of the signal splitter and a cancellation output;

a test path having a test input connected to the second splitter output of the signal splitter and a test output, the test path providing for the insertion of the device under test; and a signal combiner having a first combiner input connected to the cancellation output of the cancellation path, a second combiner input connected to the test output of the test path and a combiner output, wherein the signal splitter is located between the apparatus input port and the cancellation and test inputs and the signal combiner is located between the cancellation and test outputs and the apparatus output port.

21. The apparatus of claim 20, wherein the cancellation path comprises a phase shifter between the cancellation input and the cancellation output, and wherein the test path comprises an output attenuator between the device under test and the test output of the test path.

22. The system of claim 19, further comprising a computer controller for controlling the operation of the measurement system.

23. The system of claim 19, wherein the measurement processor is a spectrum analyzer.

24. The system of claim 19, wherein the signal source is an arbitrary waveform generator.

* * * * *